United States Patent [19]
Sperlazzo et al.

[11] Patent Number: 5,570,028
[45] Date of Patent: Oct. 29, 1996

[54] METHOD FOR DETECTING FAULTS IN ELECTRICAL CABLES AND APPARATUS FOR IMPLEMENTING SAME

[75] Inventors: Thomas M. Sperlazzo, Edison; Garrett S. Sylvester, Mountain Lakes; Jack F. Trezza, Hopatcong, all of N.J.

[73] Assignee: Lucent Technologies Inc., Murray Hill, N.J.

[21] Appl. No.: 367,410

[22] Filed: Dec. 30, 1994

[51] Int. Cl.⁶ .................................................. G01R 21/06
[52] U.S. Cl. ........................ 324/528; 324/529; 324/530; 324/67
[58] Field of Search ....................... 324/529, 530, 324/520, 521, 67, 528

[56] References Cited

U.S. PATENT DOCUMENTS

| | | |
|---|---|---|
| 4,298,864 | 11/1981 | Mahnke et al. . |
| 4,700,188 | 10/1987 | James . |
| 5,157,744 | 10/1992 | Korotky . |
| 5,168,414 | 12/1992 | Horstmann . |
| 5,237,480 | 8/1993 | Dara . |
| 5,272,439 | 12/1993 | Mashikian et al. . |
| 5,272,440 | 12/1993 | Weynachter et al. . |
| 5,365,164 | 11/1994 | Lowenstein ............................ 324/520 |
| 5,383,084 | 1/1995 | Gershen ................................. 324/520 |
| 5,438,266 | 8/1995 | Tsang ....................................... 324/67 |

*Primary Examiner*—Kenneth A. Wieder
*Assistant Examiner*—Jose M. Solis

[57] ABSTRACT

Apparatus for identifying faults within electrical power cables is provided. The apparatus allows a user to detect faults in cables regardless of the cable environment's noise content. Circuitry may be included for filtering the received test signal based on an understanding of a generic urban noise environment. The apparatus can provide the user with the size and direction of the test signal at a particular testing location.

48 Claims, 8 Drawing Sheets

METHOD FOR DETECTING FAULTS IN ELECTRICAL CABLES AND APPARATUS FOR IMPLEMENTING SAME

BACKGROUND OF THE INVENTION

1. Field of the Invention

The present invention relates to the detection of faults in underground electrical power cables.

2. Description of the Related Art

A conventional method used by electric utility companies and like facilities for isolating faults in underground power cable relies on a technician's observation of needle deflections that are induced within hand-held meters. Pulse signals generated by a capacitive discharge (CD), kenotron surge, or thyratron unit are transmitted along the cable under test and portions of the pulse signals are coupled into the hand-held meter through pick-up coils placed directly on the cable under test. Needle deflections at the pulse repetition frequency of the received pulse are observed by the technician. The cable portion beyond which the needle deflections are observed to drop off in amplitude is where the fault is assumed to lie.

The above-described conventional fault detecting method suffers from several disadvantages. For example, conventional hand-held meters are relatively sensitive to fluctuations in the background, and particularly to magnetic fields induced by currents in other nearby power cables. This leads to inaccurate detection, particularly in noisy urban environments. For example, within a typical urban, high noise background, needle fluctuations generally do not provide a user with the processing "history" needed to reject noise-induced false detections. Also, because the needle of the hand-held meters is deflected in response to a rectified signal, the polarity information inherent within the detected signal is destroyed. Further, because of the need to place the sensor head, i.e., pick-up coil, of a conventional unit directly on the faulted cable, the manhole at the test point must be cleared of water, other fluids, and debris. This is a lengthy and expensive procedure, particularly if the fluids are hazardous (e.g., PCB containing).

SUMMARY OF THE INVENTION

This invention provides a method and apparatus for detecting faults in power cables operating within noisy electrical environments. The method includes receiving within a detection apparatus a test signal transmitted through a cable under test and processing the detected signal based on some knowledge of the noise environment. The type of processing is test-signal dependent, and preferably includes filtering the received signal to remove portions from the signal's spectrum at multiples of the predominant noise frequency (i.e., by comb filtering). The filtering may be performed with analog filters, but is preferably digitally performed after the received test signal is digitized. For example, a capacitive-discharge (CD) or kenotron-surge generated test signal that is received and digitized at the apparatus may be differenced with a representative version of the digitized signal that has been shifted integral multiples of a period to remove low-frequency, periodic noise. Data extracted from the processed signal are then communicated to a user in visual form, e.g., a strip-chart display.

Apparatus of this invention includes a front-end section for receiving a portion of a test signal detected at some point along the length of an electrical cable under test. The signal is preferably detected within a signal detector that is electrically coupled to the front-end section of the invention. Preferably, a detector and power supply are housed in a housing that is separate and removably attached to the apparatus. The front-end section conditions the received signal to assure its compatibility with processing means. The processing means extract useful information regarding the cable fault position from the conditioned test signal. The processing means may be analog or digital. When digital processing means are utilized, means are also included within the apparatus for transforming the conditioned continuous-time test signal to a digitized signal. The information extracted during processing is then displayed to the user via a display.

For use with a thyratron testing technique, the conditioned test signal is preferably processed within digital signal processor which implements a filter function displaying a transfer function with sharp peaks at one or more even, and zeroes at all odd multiples of 60 Hz. The filter function thereby eliminates substantial noise components from the digitized signal at 60, 180, 300 Hz, etc. Preferably, the apparatus includes means to perform a matched filtering function which allows for a determination of current flow direction from thyratron test signal data.

For use with a capacitive discharge or kenotron surge technique, the processor preferably implements a filter function defined by a transfer function displaying zeros at all multiples of 60 Hz. The filter function thereby removes all harmonics of 60 Hz within the detected test signal. A second filtering function may be performed by the processor for capacitive discharge processing to identify the faulted cable at a split or "T" in cable routing. In particular applications, the digital signal processor may implement three notch filters, preferably infinite impulse response filters, which define nulls at 25, 50 and 75 Hz, the harmonics associated with subway power system operation. The notch filter functions are performed in series with the comb and integration filter functions.

The apparatus provides for the real-time display of the results of the processing of the test signal. By observing the processing results, the user (i.e., technician) is able to distinguish the test signal from the impulsive noise environment as well as identify Current flow direction within a feeder cable. The apparatus, therefore, identifies electrical cable faults more precisely than do conventional apparatus. The apparatus of this invention may be hand-held and battery powered, or mounted within a moving vehicle with an independent power source.

BRIEF DESCRIPTION OF THE DRAWINGS

Various embodiments are described herein with reference to the drawings, wherein.

DETAILED DESCRIPTION OF THE PREFERRED EMBODIMENTS

Figure 1:
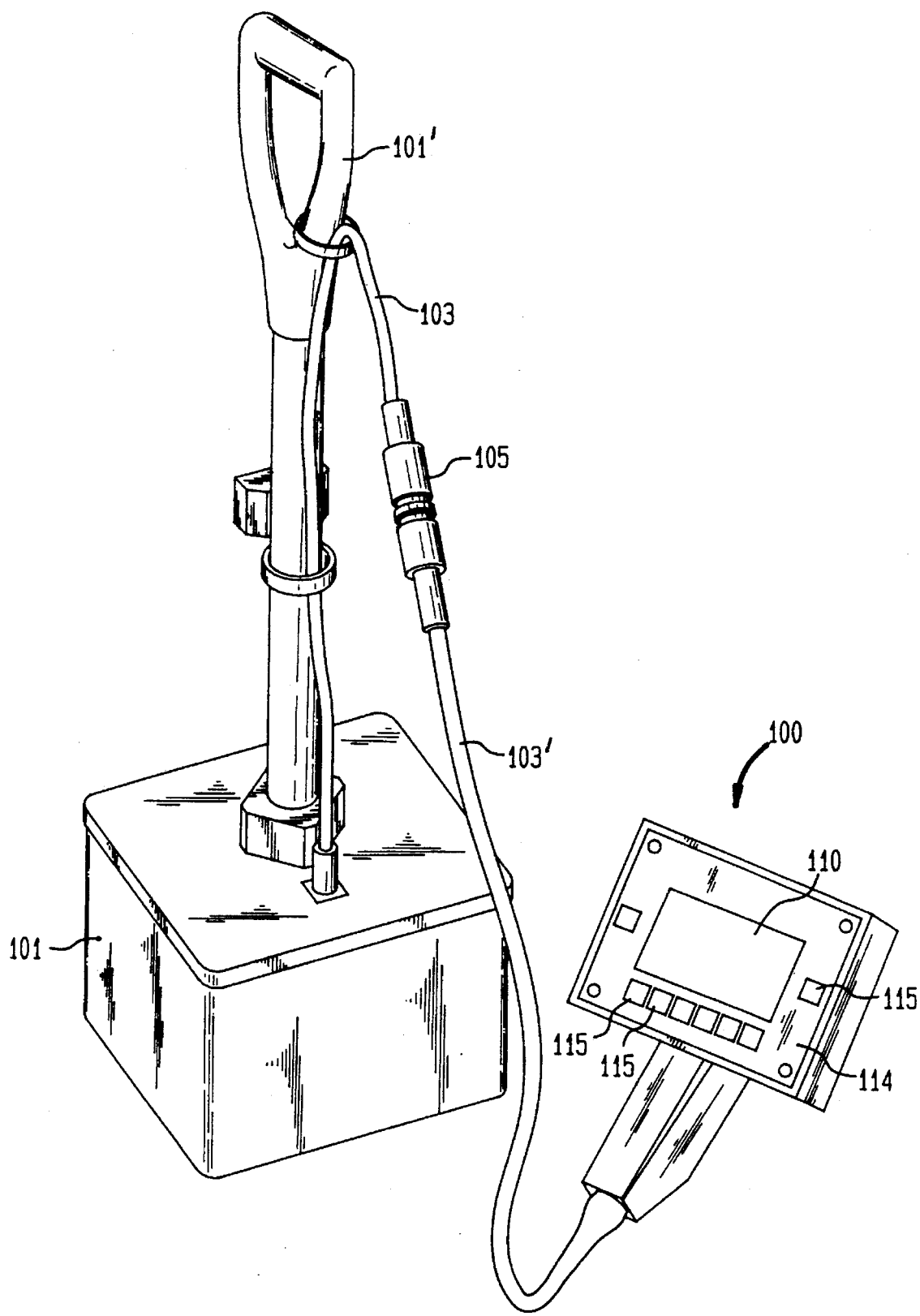
FIG. 1 is a frontal perspective view of an apparatus for detecting faults in electrical cables in accordance with this invention.

Apparatus for detecting faults in electrical cables provides service personnel with the ability to accurately localize power line faults, within underground power cables, typically without having to enter manholes. A preferred version of the invention is shown in FIG. 1, which embodies a compact, real-time meter for fault monitoring, referred to hereinafter as hand-held apparatus 100. Apparatus 100 is shown including a display 110 and a key encoder 114 for providing user input keys 115. The processing electronics (processing means) are housed within the apparatus 100. A detection base and power section 101 (including a handle 101') is shown electrically connected to apparatus 100 via cables 103, 103' and connector 105.

The hand-held apparatus 100 allows a user to accurately and conveniently monitor a cable under test, providing support for several testing techniques, including capacitive discharge (CD), kenotron surge and thyratron. During testing, the hand-held apparatus is transported to a testing location, i.e., on a street or sidewalk below which resides the underground cable under test. A test signal is launched into the cable under test and detected via an external sensor that couples a portion of the signal into the apparatus. The sensor is typically a changing magnetic field sensor (not shown in FIG. 1) housed within the detection base and power section 101 which detachably connects to the apparatus.

Capacitive discharge (CD) testing, as distinguished from thyratron testing, provides for several important considerations. CD processing preserves information in the received test signal from which the direction of current flow can be easily inferred. A similar signal to the type developed by the capacitive discharge techniques is the kenotron surge. CD pulses are generated by commercially manufactured test sets sold by vendors such as Hipotronics, Inc., of Hartford, Conn., and General Electric Corporation, of Fairfield, Conn. Typically, a test set contains both a CD unit and thyratron unit. The CD pulse itself is normally created by switching a charged capacitor bank onto the faulted feeder through a spark gap. Kenotron surge signals are generated by a high-potential source that is attached to the faulted feeder and ramped up in voltage over a period of several seconds until the fault arcs over. Test signals generated by kenotron surge are sufficiently similar in character to CD signals that the same processing techniques may be used to extract information from detected kenotron surge signals as with CD generated test signals.

Thyratron processing is distinct from CD and kenotron surge processing. Thyratron signals are typically generated in the same test sets as CD signals, but by significantly different means. The thyratron signal is nominally 10 amps and several kilovolts, with duration of about 0.5 seconds. Thyratron signals are rich in DC and multiples of 120 Hz. Thyratron signal signatures are similar to the noise background from which they are to be extracted, complicating the noise filtering task. The noise consists primarily of 60 Hz harmonics, where noise within the odd harmonics (i.e., 60, 180, etc.) is most prominent. Thyratron signals show most of their energy at even multiples of 60 Hz. Because of the differences between thyratron and CD test signals, the processing means within the apparatus relies on filtering functions designed to process signals generated by one or the other techniques. Further, because thyratrons are not manufactured in accordance with any particular industry standard. Different thyratrons generate different signal signatures, sometimes requiring separate processing techniques or implementation of a "general" technique.

To accommodate varying thyratron signal-generating techniques, filtering functions performed by the processing means on detected thyratron signals implement a comb filter to remove the odd harmonics, followed by a narrowband filter function with a window at 120 or 240 Hz, where the majority of the thyratron signal energy lies. "Comb filter" is intended to mean a filter the transfer function of which includes a sequence of nulls designed to suppress noise at the null frequencies while passing most of the rest of the signal without substantial modification. By further including sensitive signal-to-noise matched filter functions within the thyratron processing procedures (to be discussed in greater detail below), hand-held apparatus of this invention has been found to better reject noise than a narrowband or general technique. The matched filters also preserve the directional information inherent in the test set signal.

To accommodate the varying CD and kenotron surge signal processing techniques, the signals are passed through a "comb" filter function with nulls at all multiples of 60 Hz. The comb filtered data are then processed within an integrating filter to enhance the user's ability to discriminate between faulted and unfaulted legs at a T-junction in the cable. Preferably, the data are processed within a set of notch filters to remove periodic noise generated by the system providing 25 Hz power to the subways.

Figure 2:
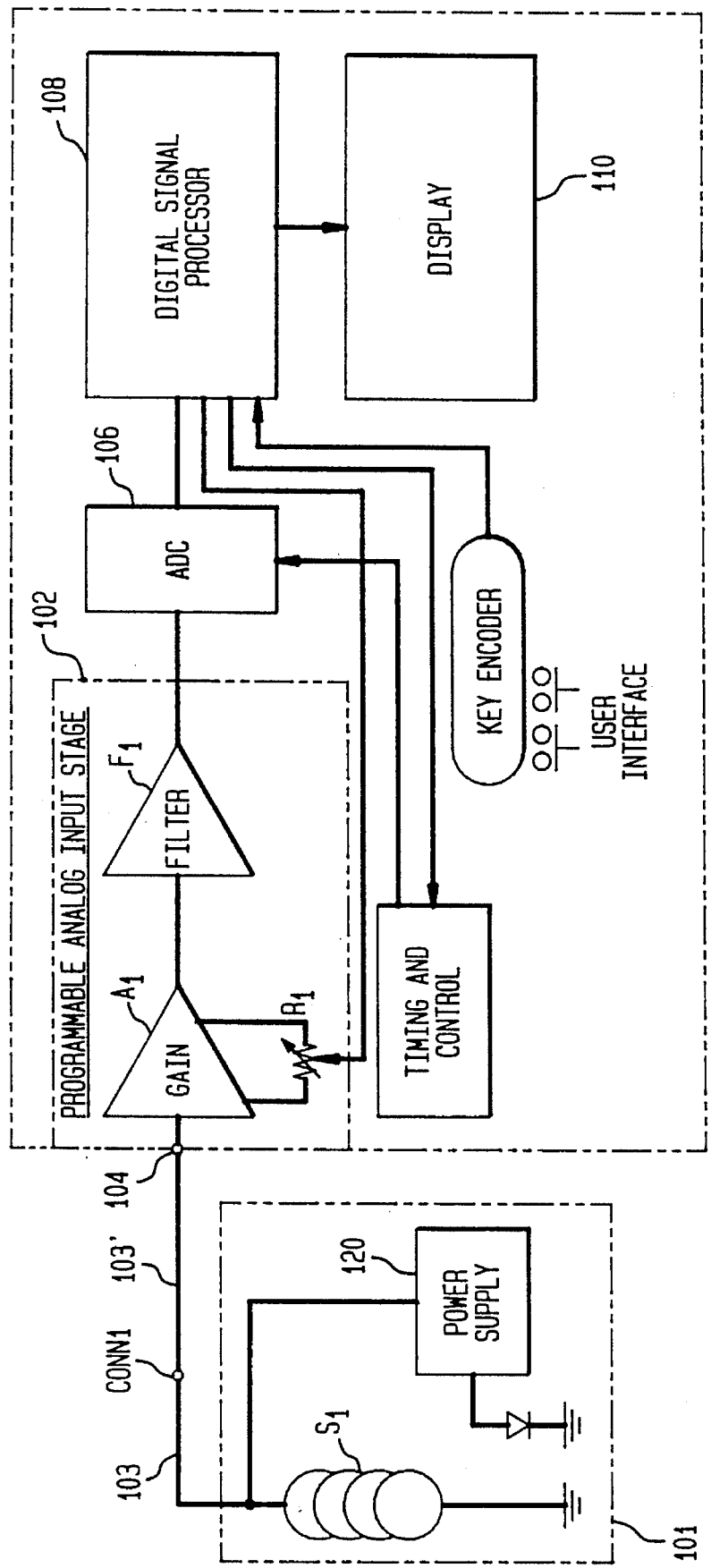
FIG. 2 is a circuit schematic block diagram of the apparatus of FIG. 1.

FIG. 2 is a functional block diagram of the hand-held apparatus 100 shown in FIG. 1, and briefly described above. The apparatus is shown attached to detection base and power section 101, which houses a magnetic field sensor S1 and power supply 120. The sensor detects a test signal transmitted through the cable under test. The apparatus is preferably used above ground, the sensor S1 placed on the street or sidewalk in an area proximate the underground cable. Detected signal energy travels from the sensor along cable 103 through a connector, 105. Connector 105 couples the signal through a cable 103' into a port 104 at the apparatus. Port 104 inputs the detected signal to programmable input stage 102, i.e., front end section. Programmable input stage 102 analog filters and adjusts the gain of the detected test signal. The apparatus may be switched between modes of operation designed for CD and thyratron testing techniques.

Programmable analog input stage 102 includes an amplifier $A_1$ which preferably displays a minimum input impedance of 50 kohms. After amplification (gain adjustment) therein, the amplified analog signal is passed to a multi-pole, anti-aliasing filter, preferably with a corner frequency at 5 kHz, to remove high frequency components that could alias into the pass band. The front end, i.e., programmable input stage 102, allows the user to control the variable gain (ultimately, the scale of the displayed data) via range control switch 115 (to be discussed below) and thereby deliver optimal signal-to-noise performance. Amplifier stages may be AC coupled to minimize DC offsets. The analog input stage 102 provides the proper drive to condition the signal for the A/D converter.

Three different techniques may be implemented within the analog input stage 102 for adjusting the received test signal for processing. A first technique utilizes a plurality of digitally controlled analog switches within a feedback path of amp $A_1$ to control the gain of the detected signal before it is analog filtered. A second technique utilizes a digitally-controlled potentiometer at amp $A_1$ and a third technique utilizes a programmable gain amplifier to implement amp $A_1$, the gain of which may be controlled by the user.

The first technique offers high accuracy in absolute gain, i.e., up to one or two percent, based on resistor tolerances within the analog switches. For example, an LTC 222, manufactured by Linear Technologies Corporation of Milpitas, Calif., may be used herein as the digitally controlled analog switches. Analog switches typically introduce very little noise when not switching. Implementing the first technique within the apparatus 100, however, requires appropriate decoding.

The second technique makes use of a digitally controlled potentiometer, e.g., a digitally controlled non-volatile potentiometer or $E^2POT$, such as that manufactured by XICOR™ Corporation, of Milpitas, Calif. The $E^2POT$ offers a single chip solution for front end gain, displaying fine gain granularity and requiting minimal hardware interface circuitry. The end-to-end resistance of $E^2POTs$, however, could vary as much as 20%. Further, additional software would need be developed for use within the processor-means to support a serial interface to an $E^2POT$ to control the front end gain.

The third technique may be implemented with a digital programmable gain amplifier (PGA), e.g., PGA103 from Burr-Brown, of Tucson, Ariz. The PGA provides variable gain with high accuracy, low noise and offset, and requires minimal additional components to integrate the PGA within the analog input stage 102. One critical factor in selecting a digital PGA for use with this invention is fixing the amplifier's gain step size to provide appropriate granularity. While gain adjustment using the Burr-Brown PGA or like device provides gain in powers of 10, i.e., 1, 10, 100, 1,000, other PGAs are available to provide increased granularity if required. For example, the LH0086C from National. Semiconductor, of Santa Clara, Calif., has programmable gain settings, of 1, 2, 5, 10, 20, 50, 100 and 200. One skilled in the art will appreciate, however, that small signal bandwidth tradeoff at high gain settings requires close scrutiny in choosing a PGA. PGAs typically display the lowest overall noise specifications of the three described techniques, in part because its gain switches are contained within the same amplifier package, minimizing noise injection. For best signal to noise ratios, the gain is preferably adjustable from 0 dB to 58 dB.

Regardless of techniques utilized for adjusting the detected test signal, the conditioned signal is transferred from analog input stage 102, after conditioning, to a 12-bit analog-to-digital converter (ADC) 106. In the preferred form, the conditioned signal is converted to a digital representation within three microseconds. The accuracy of the ADC's 12-bit dynamic range depends on the ability of the operator in the field to adjust analog gain properly, i.e., sensor sensitivity. Sampling rates for the CD sensor are preferably 12 ksamples/sec.; sampling rates for thyratron processing are preferably 2.4 k samples/see. The 12-bit converted data is transferred from the ADC to the processing means, i.e., a digital signal processor (DSP) 108.

DSP 108 generates the system sample rate, reads the quantized system samples from the analog-to-digital converter (ADC) 106 processes the quantized digital data within switch controlled, predefined filter functions, services user key input requests, varies the analog gain at the front end, and drives and manages the user display. Since the capacitive discharge processing rate was selected as an integer multiple of the thyratron rate, it is recommended that the thyratron data be over-sampled by a factor of 5 (i.e., 12 kHz), then filtered and decimated to 2.4 kHz by functions implemented by the digital signal processor (DSP) 108. The rate at which the apparatus (i.e., the DSP 108) samples the available input data can be determined by an internal DSP timer 107, which can generate an interrupt at the preferred sampling interval. Changing the sampling rate is accomplished by reprogramming timer configuration registers to which the DSP timer is responsive. For every sample interval, the DSP 108 reads the digital data provided by ADC 106 via the DSP's parallel port and begins the command sequence for the next A-to-D conversion. Table 1 below summarizes the relationship between gain, input levels and analog-to-digital conversion (ADC) resolution.

TABLE 1

| Gain Setting | Selected Mode | Gain (Voltage) | Gain (dB) | Maximum Peak Input Level | ADC Resolution (approx. step size) |
| --- | --- | --- | --- | --- | --- |
| 1 | CD | 1 | 0 | +/−2.4 V | 1.2 mV |
| 2 | CD | 4 | 12 | +/−600 mV | 293 uV |
| 3 | CD | 16 | 24 | +/−150 mV | 73 uV |
| 4 | CD | 64 | 36 | +/−37.5 mV | 18 uV |
| 1 | Thyratron | 12.54 | 22 | +/−192 mV | 94 uV |
| 2 | Thyratron | 50 | 34 | +/−48 mV | 23 uV |
| 3 | Thyratron | 200 | 46 | +/−12 mV | 6 uV |
| 4 | Thyratron | 800 | 58 | +/−3 mV | 1.5 uV |

Analog-to-digital converted data (i.e., digital data signals) are processed by filtering functions implemented within the DSP 108, depending on the type of processing selected (i.e., CD or thyratron). The functions are selected in accordance with key interrupts generated by a user pressing a key. In the preferred form, the CD processing includes processing the test signal data by a multi-replica comb filter function implemented by the DSP. The comb-filtered data is then processed by an integrator or low-pass filtering function implemented by the DSP. Finally the data are passed through three second-order infinite impulse response (IIR) notch filter functions implemented by the DSP for removing "subway-generated" noise from the CD test signals (i.e., at multiples of 25 Hz). Thyratron processing within the DSP preferably includes performing a sixth-order elliptical anti-aliasing filter function on the signal data, followed by a decimation function and a single-replica comb filter function. Preferably, narrowband IIR, absolute value and a fourth-order low-pass IIR filter are thereafter performed. Because the comb (or FIR) filter function requires processing multiple taps of which only a few are non-zero, memory resources within the DSP are preferably maximized by excluding processing on the zero taps, expediting processing to therefore to provide real-time display of the filtered data.

The digital signal processor (108) manages the display 110 sometimes referred to as a strip-chart-image display, which generates grids, legends, scales, graphical waveforms, and text representing switch settings and processing modes. The key feature of the strip-chart-image display is a constantly-updated visual record of the recent processing history. The recent processing history displayed must be of sufficient length that a user has the visual basis to reject false alarms in the displayed output data because they are observed to fall between the regularly-spaced, detected and displayed test pulses. The record on display must be long enough to show several pulses, but not so long that the pulses are squashed together (referring to horizontal spacing) and detail lost. Preferably, the record length should be between twenty and sixty seconds in length, most preferably twenty-six seconds.

Figure 3A:
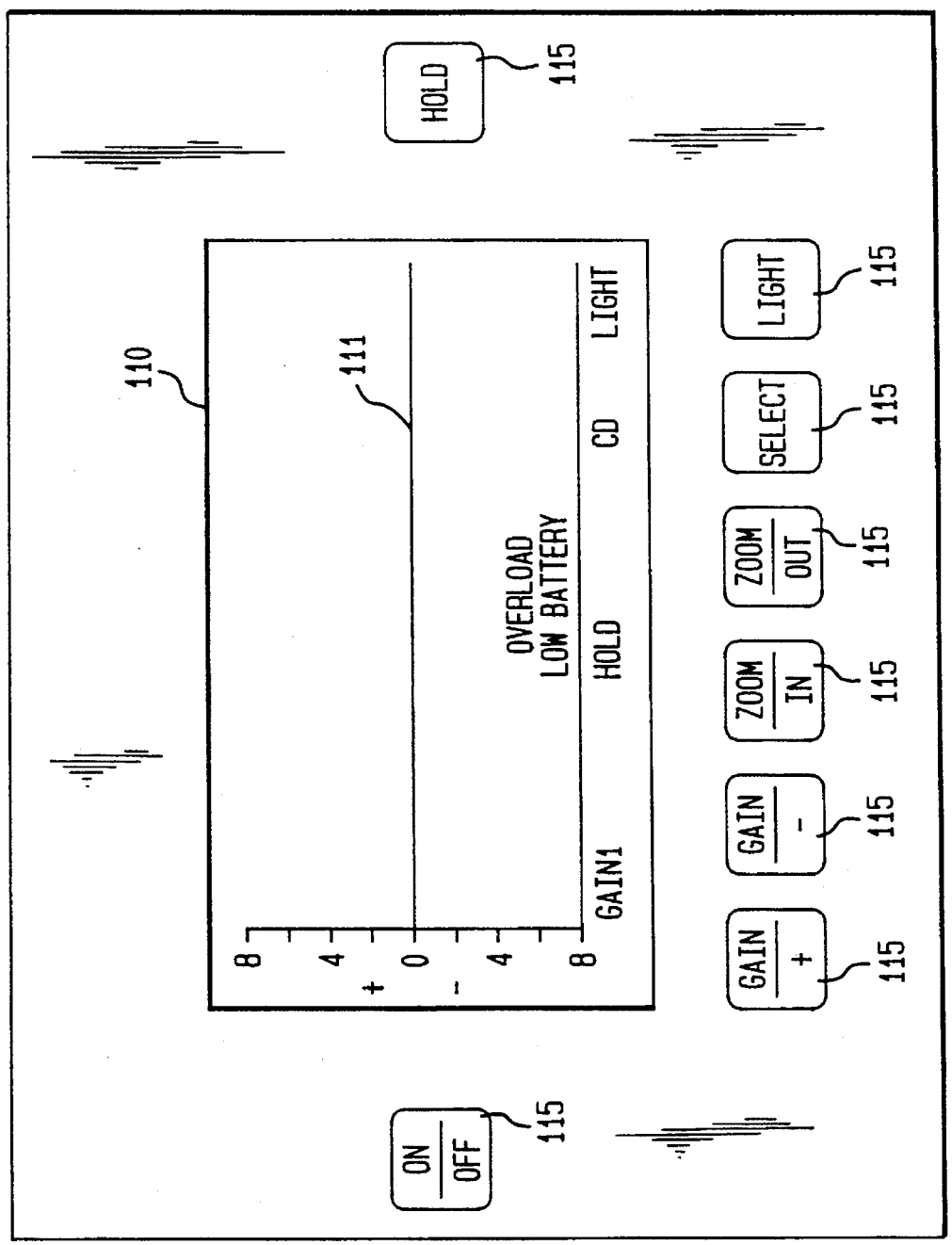
FIG. 3A is one form of a display which may be used with the present invention.
Figure 3B:
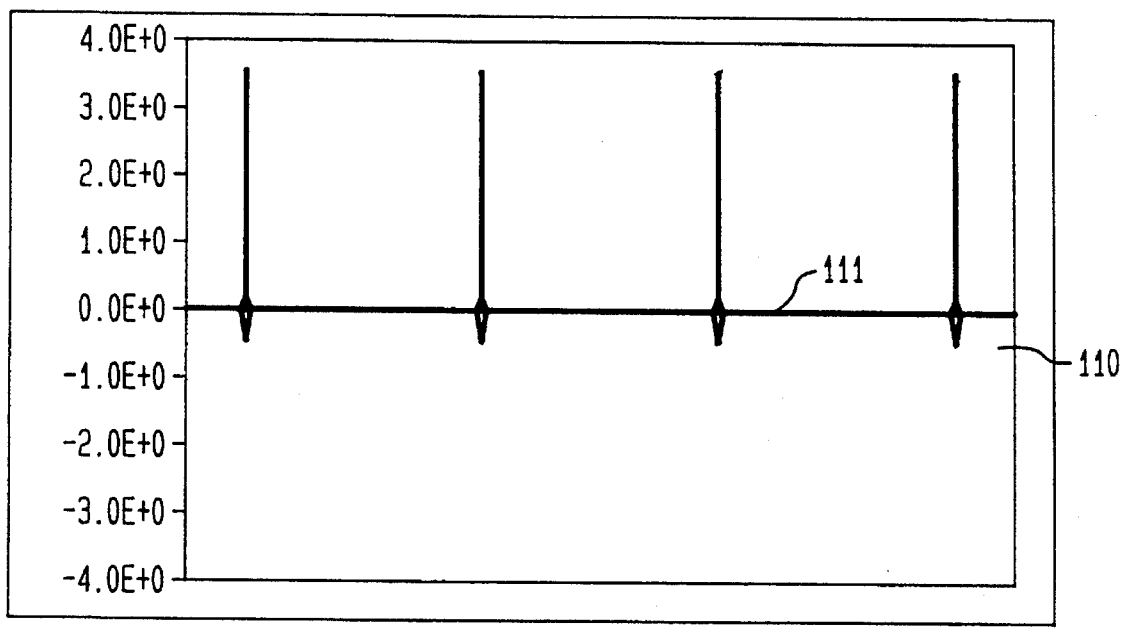
FIGS. 3B and 3C are display plots of detected CD-generated signals before and after cable faults, respectively.
Figure 3C:
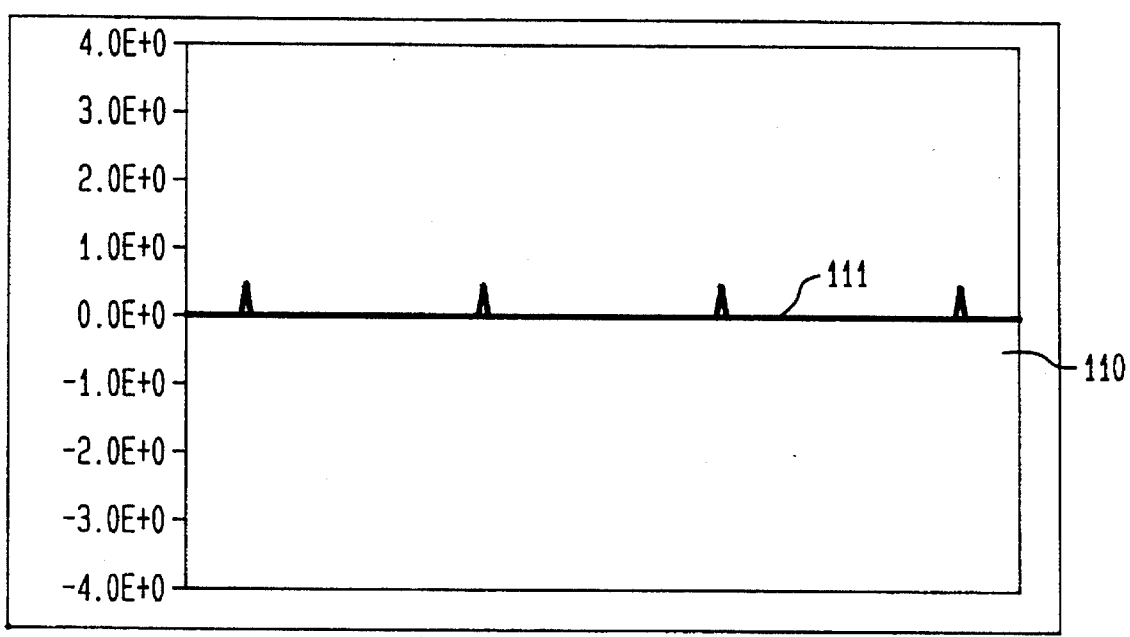
Figure 3D:
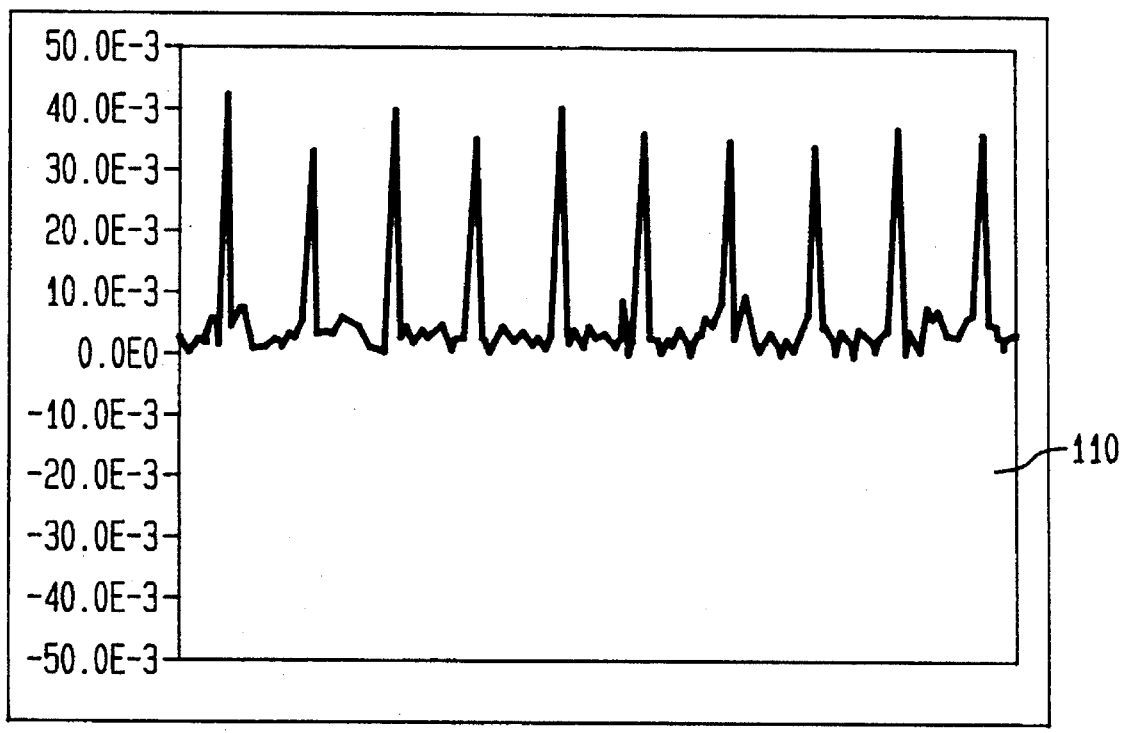
FIGS. 3D and 3E are display plots of detected thyratron-generated signals before and after cable faults, respectively.
Figure 3E:
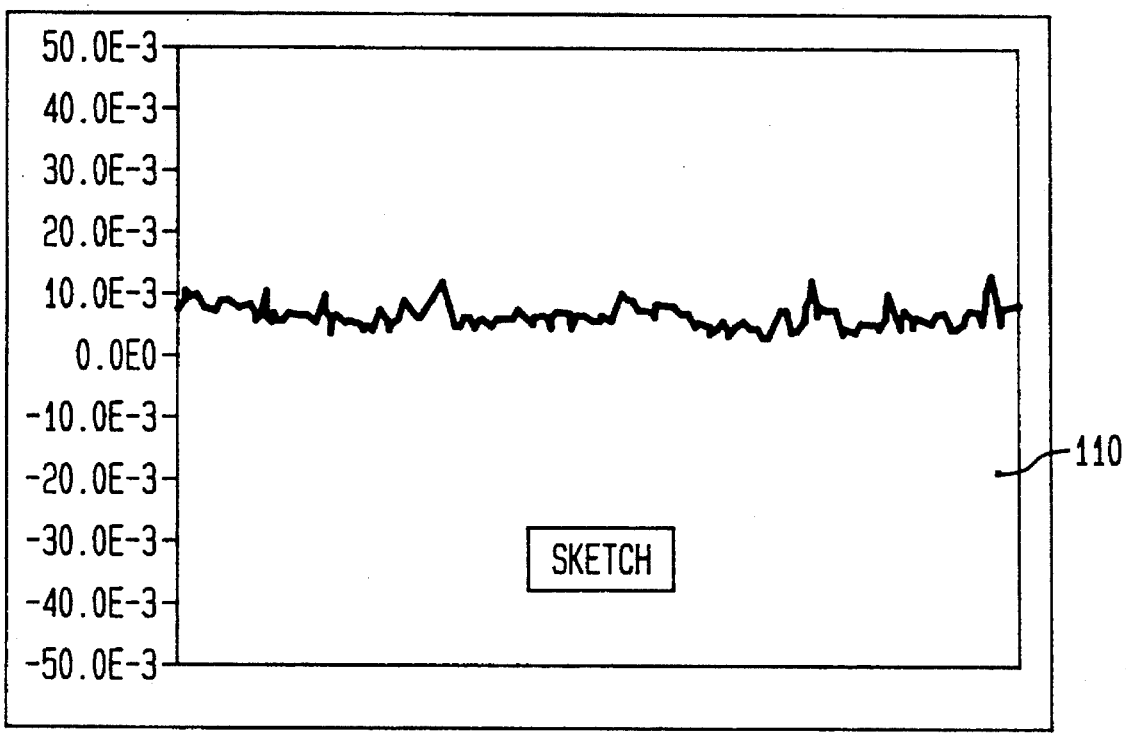

The display processing supports read and write capability and the data are memory-mapped within the DSP 108. FIG. 3A shows one embodiment of a display 110 which may be used within apparatus 100 of this invention. A signal trace 111 is shown on the display which plots a processed version of the sensor output (vertical) against time (horizontal). FIG. 3B highlights a number of CD pulses as regularly spaced narrow peaks at 6–7 second intervals. The positive pulses depicted in FIG. 3B are outgoing; negative pulses (downgoing) indicate inbound current. FIG. 3C depicts the pulses after a fault has been passed. FIG. 3D highlights a number of thyratron pulses. Thyratron pulses are substantially broader than CD pulses, i.e., 0.5 to 1.5 sec., and are usually separated only by 3–5 seconds. Finally, FIG. 3E shows a set of thyratron pulses after a cable fault has been passed.

The DSP 108 supports interrupt-based key-scan encoder 114 to provide the user the ability to modify apparatus operation. When a key 115 is depressed, an interrupt is generated which directs the DSP to take action appropriate to the requested action according thereto. Most user input keys only modify processing modes and parameters. Details of the display operating modes (activated by keys 115), preferred displays and display formats will now be discussed. In a preferred embodiment, key-scan encoder 114 includes 8 switches to provide the operational capabilities defined in Table 2 below. The switches are small, preferably momentary push button type switches, which minimize space upon the unit. Low profile or membrane panel switches are most preferred to avoid accidental depression during operation. The switches are activated when a user depresses each switch's associated key 115.

TABLE 2

| Name | Function | Type |
|---|---|---|
| Power | Turns unit power "ON/OFF" | Momentary/N.O |
| Gain– | Decreases the analog front-end gain by a fixed step size to allow larger input signals (closer to source). | Momentary/N.O. |
| Gain+ | Inceases the analog front-end by a fixed step size to provide more gain on input signals (further from source.) | Momentary/N.O. |
| Light | Depressing toggles the LCD backlight on and off. | Momentary/N.O. |
| Select | Depressing toggles the processing between CD and Thyratron processing. | Momentary/N.O. |
| Hold | Stops sensor processing, prohibits the display from updates and puts | Momentary/N.O. |

TABLE 2-continued

| Name | Function | Type |
|---|---|---|
| | the unit in standby mode. Depressing any key resumes normal operation. | |
| Zoom+ | Increases the display scale by a factor of 2 (zoom in). | Momentary/N.O. |
| Zoom– | Decreases the display scale by a factor of 2 (zoom out). | Momentary/N.O. |

While most user input keys 115 (switches) merely modify processing modes and parameters, the, "gain +/–" keys modify front end gain and output gain 102 by factors of four. The DSP 108 responds to the "gain +/–" keys by performing a decoding function if the front end gain adjustment is performed with analog switches or programmable gain amplifiers. The DSP 108 resets the front-end gain on power up to a default value of 0 dB. When the "hold" key within the key-scan encoder 114 is depressed, the DSP stops updating, holds the display 110, disables any back lighting and puts itself into a low power (standby) mode to conserve battery capacity. Once in standby mode, pressing the "hold" key again will return the apparatus to normal operation. The user may zoom in and out while in hold mode. By freezing the results of the display at one measurement site, and resuming processing at the next measurement site along the feeder under test, the user can easily compare amplitudes of the detected, processed pulse signals without the need to write down or remember the values from the first site.

When the input samples are determined by the DSP 108 to exceed a pre-defined threshold, the DSP indicates on the display 110 that an "overload" condition has occurred. This display informs the user that input gain is set too high and requests the user to select the next higher gain setting (lower gain). The "light" key toggles between LCD blacklight on and off with each keypress to provide the user with a low power mode. A timer will shut down the backlighting within a predetermined time if not shut off by a user to conserve battery power. The "select" key toggles processing between CD and thyratron. The "zoom+/–" keys increase/decrease the display scale by factors of 2 for each keypress. When the "zoom+" key is depressed, maximum display scale will halve (e.g., 32 to 16) and displayed data will double in amplitude. Conversely, when the "zoom–" key is depressed, the display scale will double (e.g., 16 to 32) and the amplitude of the displayed data will be halved to prevent display overflow.

A supplemental keyboard encoder (not shown in the drawings) may be incorporated if needed, as well as a port for receiving the keyboard input. Preferably, this is accomplished with a single chip key encoder such as the 74C922, manufactured by National Semiconductor of Santa Clara, Calif. The 74C922 device embodies an eighteen pin self-contained DIP, which supports up to sixteen switches. The device also provides for key debouncing and can be I/O mapped to the DSP without external "glue" logic.

Various commercial displays may be used within the apparatus of this invention, e.g., electroluminescent (EL) displays, plasma displays, vacuum fluorescent (VF) displays and liquid crystal displays. Liquid crystal displays are preferable, a super twisted nematic based LCD being most preferable. Nematic technology based LCDs are low power, i.e., less than 10 $\mu W/cm^2$, low voltage, compact in size, rugged, cost effective and easy to read in most environmental conditions. For example, a LM4229BG128G240WCG LCD display, manufactured by Densitron Corporation, of Torrance, Calif. offers a graphics array of 240 by 128 pixels and may be utilized effectively in the current invention.

There are, however, drawbacks to LCD technology. For example, LCD displays have a limited viewing angle which must be specified to the manufacturer during ordering. Preferably, a "12-o'clock" or straight-on viewing angle should be selected. This provides a +/−30 degree variation in viewing angle before display becomes unreadable. Various other viewing angles may be specified, however, depending on need. LCDs also show down in response to drops in ambient temperature. At the lowest rated operating temperature, display response could drop to 200–500 msec. By providing an LED backlight option, while increasing power consumption over EL type displays, the integrity of the display is extended. Because it is desired to provide a minimum a eight hours operational time on a single charge for remote operations (200 mAmps, or, 500 mA with backlighting), a nickel-cadmium (NiCd) 7.2 V battery pack, consisting of 6 D cells, is preferable for use with the apparatus. To minimize power consumption, a timer may be incorporated into the apparatus to disable backlighting after a certain time interval of operation. The Densitron display is a 240×120 graphics display that includes an on-board controller to provide simultaneous display of both graphics and text. A most preferable Densitron display includes an onboard temperature compensated LCD bias voltage generator.

Figure 4:
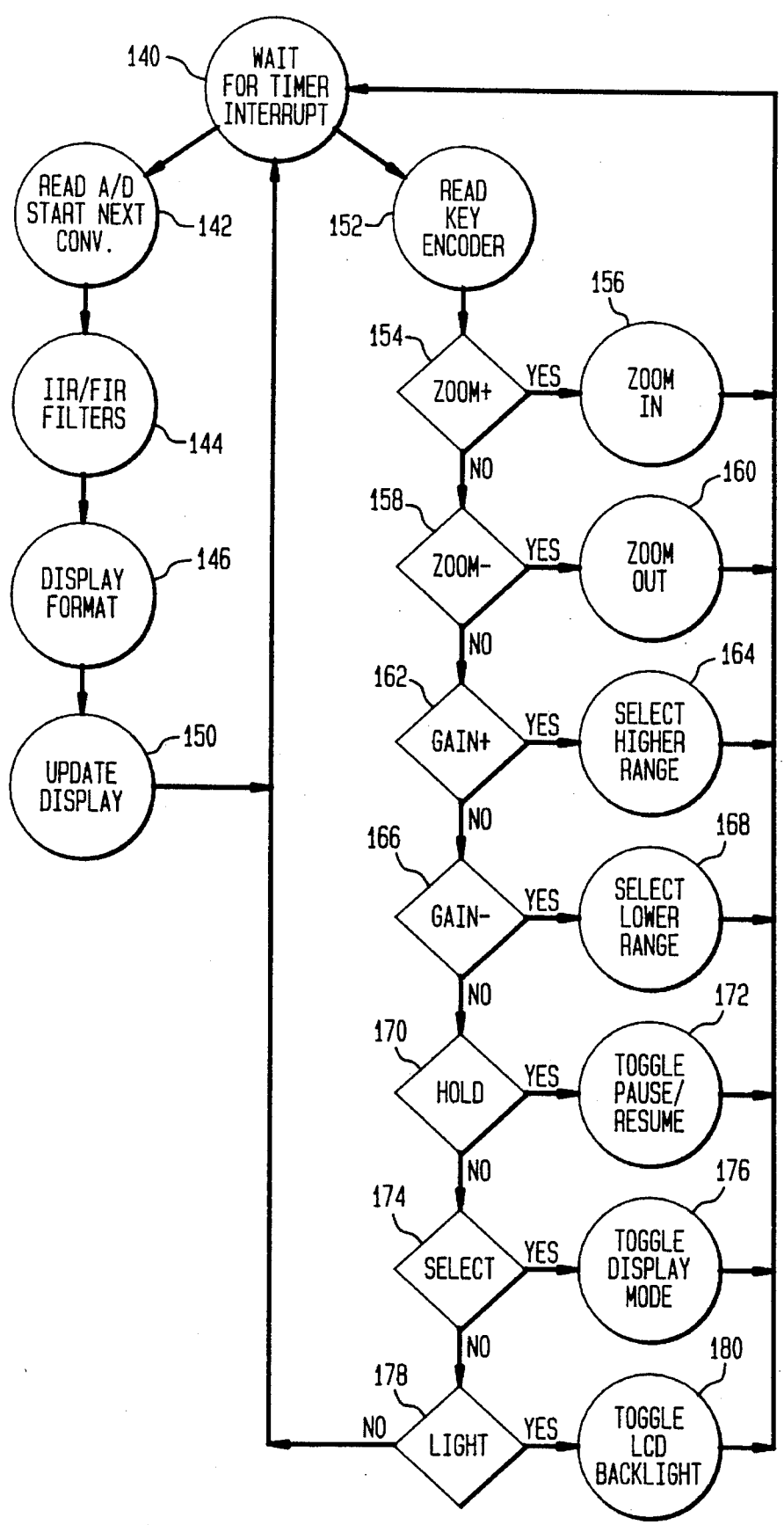
FIG. 4 is a flow block diagram defining the functionality of the digital signal processor depicted in FIG. 2.

FIG. 4 is a block diagram depicting a preferred processing method performed on test data by the digital signal processor 108 of the present invention. Flow block 140 represents a step in which the DSP 108 pauses processing or waits for a timer or user key interrupt, i.e., the wait state. Upon receipt of a timer interrupt signal, DSP control proceeds to a step identified as flow block 142, in which the digitally converted data are read from the ADC 106 by the DSP, and the next A-to-D conversion with the ADC is begun. DSP control then proceeds to a step represented by flow block 144, where the digital data are processed through the system's IIR/FIR filters (to be discussed in greater detail below). DSP control then proceeds to a step identified as "display format", represented as block 146. The display format step enables the display 110, provides for the current configuration, provides status and the user settings to the display. DSP control then proceeds to a step in which the display is actually updated. This step is represented by block 150. The DSP processing then returns to the interrupt wait state, identified as flow block 140 and described above.

Upon receipt of a key-scan encoder 114 generated interrupt (i.e., key input 115 from a user), DSP 108 control passes from the wait state to a step in which the key encoder is read, represented by flow block 152. The DSP then determines whether the zoom+ key has been depressed, which zooms in the data displayed by a factor of two, as described above, in a step represented by flow block 154. If so, the maximum display scale is halved, as represented by flow block 156 ("zoom in"), and DSP control is passed back to the wait state of flow block 140. If the zoom+ key was not depressed, a check is made to determine if the depressed key was the zoom− key, as represented by flow block 158. If so, the data displayed are zoomed by a factor of two, as described above, in a step represented by block 160, and DSP control passes back to the interrupt wait state of flow block 146. If not, the DSP checks to determine whether the gain+ key was the depressed key, as represented, by flow block 162.

If it is determined that gain+ key was depressed, a higher range setting is implemented in a step represented by flow block 164 and DSP 108 control passes to the interrupt wait state of flow block 140. If the gain+ setting is not to be increased, program control passes to a step represented by block 166, to determine whether the gain− key has been depressed. If so, the gain is lowered, as represented by flow block 168, and DSP control returns to the wait state of flow block 140. If not, the DSP checks to determine if the hold condition key has been depressed, as represented by flow block 170. If the hold key was depressed, processing is paused in a step represented by flow block 172. Control then passes back to flow block 140, representing the wait state, where processing is sets until the wait state is again interrupted by either a keypress or a timer interrupt. If the hold key was not depressed, control passes to a step represented by flow block 174, in which the DSP determines whether the select key has been depressed.

If select processing is to be instituted (i.e., select key depressed), a step represented by flow block 176 is carried out which causes the display 110 and processing to toggle between CD and thyratron modes. The DSP 108 control then passes back to the wait interrupt state of block 140. If display mode toggling is not to be implemented, DSP control passes to a step represented by flow block 178, where it is determined whether or not the Light key has been pressed. If so, the backlighting is toggled on and off, as represented by flow block 180, and program control passes back to the wait state 140. If not, DSP control passes directly to the wait state to wait for the next interrupt, represented by flow block 140.

Figure 5A:
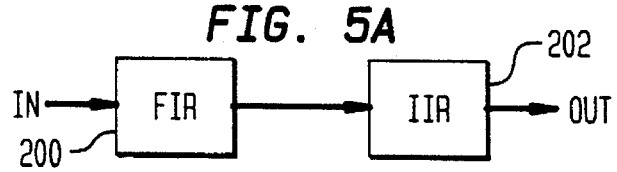
FIG. 5A is a schematic flow diagram depicting one embodiment of an FIR/IIR filter function implemented by this invention.
Figure 5B:
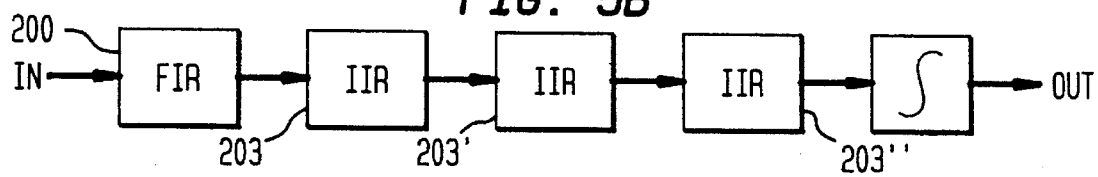
FIG. 5B is a schematic flow diagram depicting a second FIR/IIR filter function of this invention.
Figure 6:
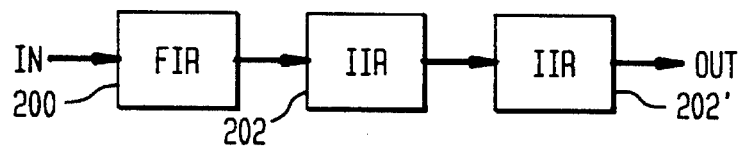
FIG. 6 is a schematic flow diagram depicting an alternative embodiment of the FIR/IIR filter function shown in FIG. 5A.

FIGS. 5–7 are flow configurations which represent several filtering functions performed by the DSP 108 of this invention. The step of filtering was referred to above, in the step represented by block 144. FIG. 5A is a schematic flow configuration representing the processing flow of digital data within DSP 108 when a filtering function for use with a capacitive discharge generated test signal is implemented. FIG. 5B is a schematic flow configuration for use with capacitive discharge techniques that includes a series combination of three notch filters 203, 203' and 203", representing nulls in the filter transfer function at 25, 50 and 75 Hz, respectively. The nulls remove the harmonics generated by power lines feeding the subways.

The flow configuration of FIGS. 5A and 5B both utilize an FIR filter function 200. FIR filter function 200 performs a "comb" filtering function on input data, outputting a signal $Y_n$ in response to a input signal $U_n$ such that $Y_n$ equals:

$$-\tfrac{1}{8}(U_{n-8p}+U_{n-7p}+U_{n-6p}+U_{n-5p}+U_{n-3p}+U_{n-2p}+U_{n-p}+U_n)+U_{n-4p},$$

where p is the number of samples in a 60 Hz period, i.e., $p=F_s/60$. $F_s$ is the recommended sampling frequency, preferably 12 KHz within the present embodiment. $F_s$ must be an integral number of 60 Hz to render the number of samples in a 60 Hz period on integer number. The "comb" transfer function displays nulls at all multiples of 60 Hz and is nearly one in magnitude between those nulls, such that a short-duration impulsive input (such as a CD hit) is transformed by the filter function rendering an identical copy of the filter input and several (8, in our preferred embodiment) smaller artifact copies (⅛ as large). The 60 Hz harmonics are removed because most background noise is periodic at multiples of 60 Hz within the United States. The artifact copies are reversed in sign and spaced out in time at 1/60 sec intervals around the large copy, about which they are centered. These small artifacts are visually negligible. Thus, the objective of eliminating the noise while leaving the signal substantially undistorted (apart from the visually negligible artifacts) is achieved.

The same effect could be achieved implementing filter functions which define varying length combs with more or fewer delayed replicas subtracted from the original. When too few delayed replicas are used, processing artifacts appear in the displayed output that cloud interpretation of data. When too many are used, nulls at 60 Hz intervals become so narrow that undesirable noise passes the filter without much attenuation. The filter characteristics may be easily varied to provide filtering at other harmonics, e.g., 50 Hz in Europe, depending on the application. This invention also envisions the implementation of a special-purpose FIR filter function that processes only nonzero coefficients, allowing rapid implementation of very long FIR filter functions with few non-zero coefficients (such as the "comb").

In the present embodiment, IIR filter function 202 performs an integrating function. The integrating filter serves to make the processed signal more a measure of current in the cable than the current time derivative that is essentially sensed by the coil. This is implemented because larger currents are expected in a faulted leg than an unfaulted one. An observed side benefit is that the integrated signal representing the current often shows a negative or return-current reading in the unfaulted leg, whereas it shows positive or outbound current in the outbound leg, essentially performing a T-discrimination function. The integrator is not a true integrator, as it weights past history with an exponential falloff (things farther in the past get small weights). This is done to prevent any DC offsets (inherent in almost everything electronic) from integrating into a ramp that eventually runs off the display and out of the dynamic range of the digital signal processor. The IIR filter function 202 (integrator) may be represented by a transfer function H(Z) equal to:

$$(1+z^{-1})/[1-(1-\delta)z^{-1}/(1+\delta)],$$

where $\delta$ is equal to $1/(2\tau F_s)$, and $\tau$ being the integrator time constant. A preferred $\tau$ of one millisecond provides an H(z) of $(1+z^{-1})/(1-0.92Z^{-1})$. Because the external sensor is sensitive to the time rate of change of current, and because the outgoing signal does not all return past the apparatus on a faulted leg, the faulted leg will show a higher integrated current value. Moreover, we find that the comb-filtered integrated signal on an unfaulted leg will often be opposite in polarity relative to signals detected on both the faulted and test-set legs, providing a further means of discrimination between faulted and unfaulted legs at a "T".

As mentioned above, CD processing may include performing three notch filter functions 203, 203', and 203", as shown in FIG. 5B. Each of the notch filter functions is implemented as a 2nd order biquadratic IIR (the transfer function has degree 2 in numerator and denominator both) with a null at the frequency of interest (25, 50, or 75) and near-unity magnitude elsewhere. Accordingly, low-order harmonics of the 25 Hz power generated for a subway or like transportation system can be eliminated. The three notch filters are preferably implemented in state-space form in order to minimize the noise resulting from fixed-precision arithmetic. The half-power half-width, df, of the null is a design parameter; we chose df=2 (25 Hz null), 4 (50 Hz), and 6 (75 Hz). While the preferred form of the transfer function implemented by the processor is shown below, other substantially equivalent transfer functions may be equally effective.

$$H(z)=1/D[\gamma-2\alpha z^{-1}+\gamma z^{-2}]/(D-2\alpha z^{-1}+(1+2\xi r+r^2)z^{-2})],$$

where $\gamma$ equals $(1+r^2)$, $\alpha$ equals $(1-r^2)$, D equals $(1+2\xi r+r^2)$, $\xi$ equals $(df/f_n)$, r equals $\tan(\pi f_n/f_s)$, $f_n$ is the notch frequency, preferably 25, 50 and 75, df equals the half power half-width, preferably 2, 4 and 6, and $F_s$ equals 12 KHz for CD.

FIG. 6 is a flow configuration defining implementation of an FIR filter function 200 and IIR integrator 202 of FIG. 5A, followed by implementation of a second integrating IIR 202' (i.e., the series combination of IIR filters). The transfer function of series combination of filter functions 202 and 202' is:

$$H(Z)=[1+2Z^{-1}+Z^{-2}]/[1-2Z^{-1}(1-\delta)/(1+\delta)+Z^{-2}((1-\delta)/(1+\delta))^2)].$$

By integrating the comb-filtered signal twice, the total charge (not just the current) within a leg can be identified. The pulse signal identified by charge in a faulted leg will often be largest, whereas the signal detected in the unfaulted leg will often be negative.

In general, the processing time required to run a finite impulse response filter function (FIR) is related to the length of its impulse response. The CD comb described above has an impulse response that is approximately 1600 samples long. This is somewhat lengthy for real-time implementation in a battery-powered device. However, because the filter implemented includes very few non-zero coefficients in the impulse response (i.e, nine), a special-purpose FIR implementation (discussed briefly above) is included which utilizes a circular buffer for effective real-time running. For optimal performance, the sample rate $F_S$ should be high enough so that most of the frequency content of the CD or thyratron signal sought is below $F_S/2$. A twelve KHz sample rate performs adequately for CD and kenotron surge. Because most thyratron signals are concentrated at low frequencies relative to CD signals, decimation to a lower rate may be used for thyratron processing.

Figure 7A:
FIG. 7A is a schematic flow diagram depicting another embodiment of a filtering function implemented by this invention.

FIG. 7A is a flow configuration of a function implemented within DSP 108 for use with thyratron testing techniques. Here, the DSP is configured to implement a "comb" filtering function which removes odd 60 Hz formonics from the received signal, i.e., an FIR filter function 204. The response $Y_n$ of FIR filter function 204 to an input $U_n$ is equal to:

$$¼(U_{n-p})+½(U_{n-p/2})+¼(U_n),$$

where p is the number of samples in a 60 Hz period, i.e., $p=F_s/60$. Because most thyratron energy exists at even multiples of 60 Hz, signal components at odd multiples are comb filtered out of the test signal data. In a preferred form, $F_s$ equals 2.4 KHz. If the system sampling rate is 12 KHz, the data should first be decimated within the apparatus to generate samples as if derived at a 2.4 KHz sampling rate. This is accomplished by first filtering out all components of the signal above 1 kHz and keeping every fifth sample of the 12 KHz sampled, filtered data.

Figure 7B:
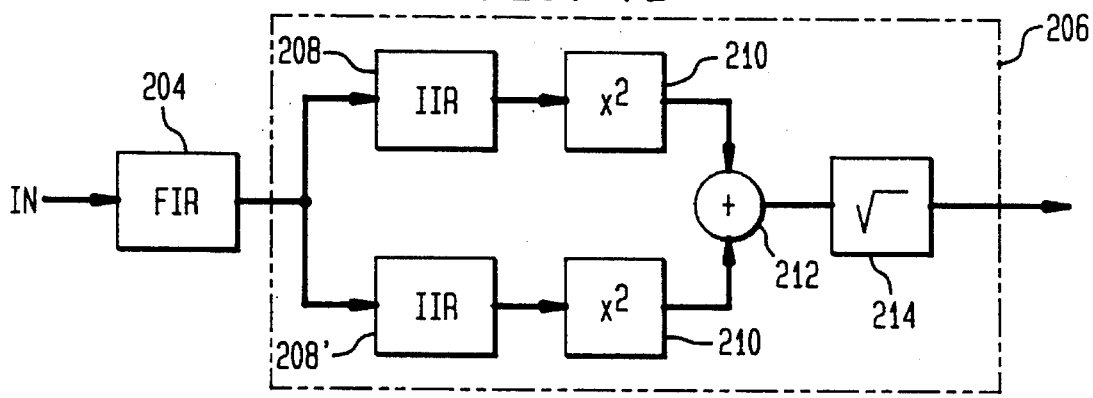
FIG. 7B is a schematic flow diagram depicting yet another embodiment of an FIR/IIR filtering function implemented by this invention.

FIG. 7B is a flow configuration of another thyratron processing filtering function implemented within DSP 108 of this invention. The function includes FIR filter function 204, as described above, in series with a filtering section 206 which performs an IIR filter function. Section 206 includes a parallel combination of: a first leg which implements an IIR filter function 208 followed by a squaring section 210 for squaring the data integrated within function 208. A second leg implements an IIR filter function 208' which is followed by a squaring section 210 for squaring the data processed Within function 208'. The data output from both legs are combined within an adder function 212 implemented by the DSP. The sum is then square rooted in a function represented by section 214 in the Figure. The transfer function of IIR filter 208, H(Z), is preferably defined as follows:

$$[2\alpha\beta/X - 2\alpha\beta Z^{-2}/X]/Y,$$

where $Y = [(1 + (2z^{-1}(\omega^2_o - \beta^2)/X) + (z^{-2}(\beta^2 - 2\alpha\beta + \omega^2_o)/X)]$
$X = \beta^2 + 2\alpha\beta + \omega^2_o$, $\omega_o$ equals the peak frequency (preferably $240\pi$ radians/sec.), $\alpha$ equals $2\pi$ times the half power line width (preferably $8\pi$), and $\beta$ equals $\omega_o \cot(\omega_o/2F_s)$. The choice $\omega_o$ equals $480\pi$ radians per second and $\alpha$ equals $16\pi$ radians per second has also been implemented. The resulting detector produces better detection results when used with Hipotronics devices. The transfer function of IIR filter 208', H(Z), is preferably defined as follows:

$$[2\alpha\omega_o + 4\alpha\omega_o z^{-1} + 2\alpha\beta\omega_o z^{-2}]/[XY].$$

IIR section 206 essentially acts as an envelope detector, providing a picture of the transmitted signal energy detected at 120 or 240 Hz to the display.

To determine current flow direction in thyratron mode, a matched filter may be implemented within the DSP 108. Because the matched filter does not employ squares or absolute values, and because there is more current flowing out towards the fault than back, the matched filter enables current flow direction determination. Further, because of the periodic nature of the noise and the known thyratron signal characteristics, it is possible to construct a matched filter such that, unlike conventional matched filters, the matched filter avoids the need for an estimate of the noise at the location where the meter is to be used.

Typically, a matched filter is matched both to the signal template it is seeking and to the noise it needs to reject. Because typical city noise (e.g., New York City) is nearly periodic, there is an insignificant loss in processing performance based on the assumption that the noise is exactly periodic and the matched filter is designed accordingly. In exactly periodic noise, the rest of the statistical character of the noise (i.e., how much of what harmonic is present) becomes irrelevant. A matched filtering method or scheme, therefore, may be implemented which depends only on the basis of the signal template being sought. Because there are only a few thyratron brands available in the market, there are only a small number of signal templates that must be implemented for thyratron processing. Preferably, a filter function can be designed for each brand and the user can select the filter function for use accordingly. If the introduced use-complication is unacceptable, the matched filters may be combined into a single filter of the length of the longest individual filter; or the filters may be run in series.

Figure 7C:
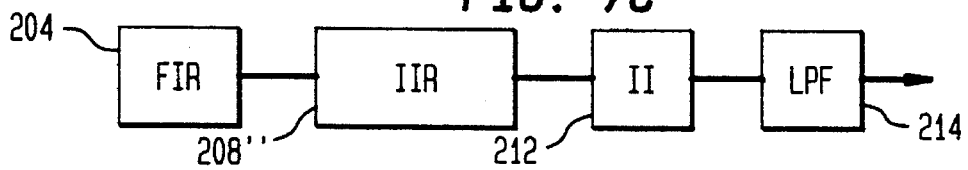
FIG. 7C is a schematic flow diagram depicting yet another embodiment of an FIR/IIR filtering function implemented by this invention.

FIG. 7C displays a flow configuration where the block 206 identified in FIG. 7B is implemented on a single IIR filter function 208". Therein, $\omega_o$ equals $240\pi$ or $480\pi$. The filtered output data are then further processed within a function 212 which derives its absolute value. The absolute value is low pass filtered in a low pass filter 214, preferably by 4th order elliptic filter having a cutoff of 10 Hz. Because this method does not require a step of determining the square root, it requires less DSP processing and is therefore preferred.

The present invention also may provide the user with the ability accurately detect faults within a faulted cable in a manner insensitive to varying cable depth. Such additional processing ability is at times quite useful, because apparatus output (directly related to the detected signal) is inversely proportional to cable depth, which can vary for numerous reasons along a length of cable. If cable depth suddenly increases, a fault could be mistakenly inferred. If depth is known, it can be scaled out by the apparatus' processing, and potential error eliminated.

Cable depth can be derived from taking an RMS valve of the detected signal amplitude at several locations $X_0$, $X_1$, . . ., $X_N$. The "X" locations are positioned on a horizontal line that is substantially perpendicular to the feeder direction. The RMS level output at the "X" location is approximately:

$$M(x) = \alpha d/[(X-Z)^2 + d^2],$$

where $\alpha$ is a constant dependent on processing function parameters and the test set pulse. $\alpha$ is not dependent on either the location X, cable plane location Z, or cable depth d.

The ratios $Y_K = M(X_0)/M(X_K) \approx [(X_K - Z)^2 + d^2]/[(X_0 - Z)^2 + d^2]$ (where k=1, 2 . . . N) are approximately quadratic functions of the inter-location differences $\zeta_K = X_K - X_0$, where $$Y(\zeta_K) = Y_K \approx a\zeta^2_K + b\zeta_K + 1,$$

where k=1, 2, . . . N. Since the pulse amplitude ratios $Y_K$ can be measured and the measurement separations $\zeta_K$ are known, the two unknown quadratic coefficients a, b can be estimated by a least squares fit. The offset, $\Delta = X_0 - Z$ of the reference point $X_0$ from the cable position Z and its vertical depth d are determined algebraically from a and b.

To implement the above-described depth-compensation method, the sensor which detects the test signal should be replaced by some means of multi-sensor pickup. The multi-sensor pickup preferably includes at least three sensors, a fourth or greater included to provide an error check. Each sensor should be separated by about a foot, preferably 20 inches or so.

The front end and A/D converter would need be arranged to accommodate the multiple sensor data, including the needed buffer space to hold approximately 10 seconds of input data from each sensor. In addition, a pair of vertical cursors and a "depth compensation" key would be preferably added to the display to communicate depth-derived information. Accordingly, under normal operation, all except reference sensor output would be ignored by the apparatus processing functions. That is, the extra A/D converter channels are cut off, etc. When the user wants to scale depth out of processing, the depth compensation key would be pressed interrupting normal processing. The auxiliary sensor channels would be activated thereby. After a pulse has been observed in depth compensation mode, the key is again depressed to stop data acquisition. The user would then center the pulse between the two added cursors upon the display, and again repress the depth compensation key. DSP 108 would then process each additional channel in sequential order, estimate RMS pulse amplitudes, compute cable depth by the above-described method and scale current and future displays by the depth estimate upon resuming normal processing.

Figure 8A:
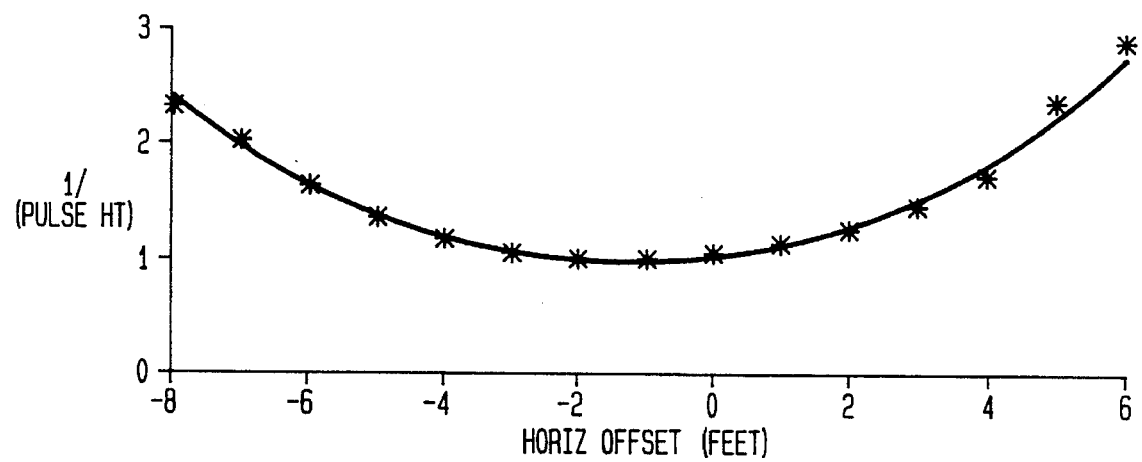
FIGS. 8A and 8B are plots of the amplitude of a detected test signal as a function of horizontal offset from a cable location.
Figure 8B:
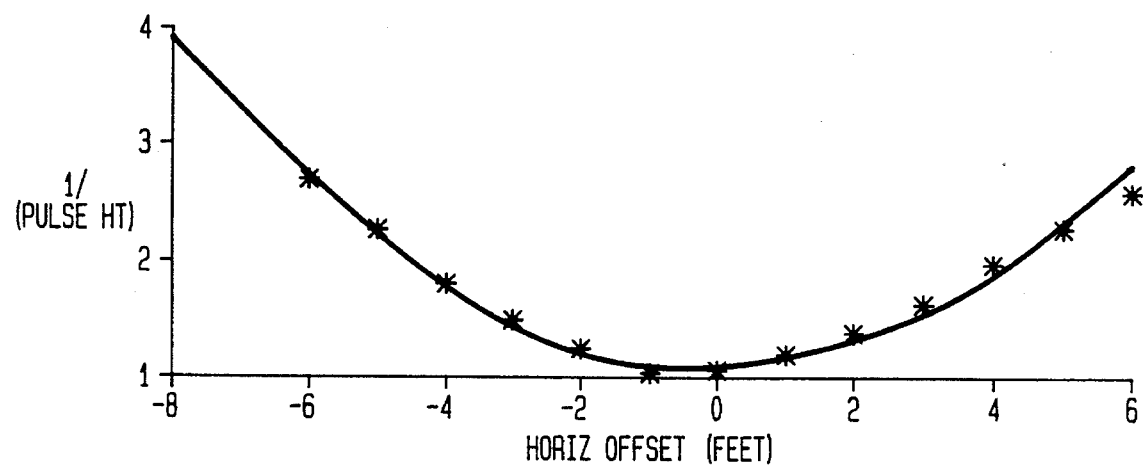

FIGS. 8A and 8B are actual display views of depth data taken at sensor offsets of around 1 foot at two different locations. The FIG. 8A location was at Archer Avenue, West of Parson's Blvd., in Queens, New York, and the FIG. 8B location was at 168 Street, South of Jamaica Avenue in Queens, New York. The FIGS. 8A and 8B estimated depths were found to be 5.5 and 4.8 feet, respectively. As can be seen from viewing the figures, depth is easily determined by simple processing, minimizing erroneous detection due to varying cable depth.

What has been described herein is merely illustrative of the application of the principles of the present invention. Other arrangements and methods can be implemented by those skilled in the art without departing from the spirit and of this invention.

What is claimed is:

1. Apparatus for localizing faults within a power line, comprising:
   a) an electromagnetic sensor interface for receiving a test signal propagating through said power line and detected by an electromagnetic sensor positioned proximate to said power line;
   b) signal conditioning means electrically coupled to said electromagnetic sensor interface for conditioning said received test signal;
   c) processing means for processing said received test signal using predetermined test signal signatures to generate usable power line fault detection data; and
   d) communicating means responsive to said processing means for communicating said usable power line fault detection data.

2. The apparatus defined by claim 1, wherein said communicating means further includes a display interface.

3. The apparatus defined by claim 2, wherein said communicating means further includes a display in communication with said display interface.

4. The apparatus defined by claim 3, wherein said display includes an ambient light and a temperature sensor.

5. The apparatus defined by claim 1, wherein said signal conditioning means includes an analog gain and anti-aliasing filtering stage.

6. The apparatus defined by claim 5, wherein said signal conditioning means includes digitally controlled front-end variable gain selection means.

7. The apparatus defined by claim 1, further including a key-scan encoder, said encoder enabling a user to control the processing by the processing means and the communication of the usable power line fault detection data.

8. The apparatus defined by claim 1, further including an analog-to-digital (A/D) converter interposed between said signal conditioning means and said processing means.

9. The apparatus defined by claim 8, wherein said processing means includes a digital signal processor.

10. The apparatus defined by claim 1, wherein said processing means includes means for performing FIR and IIR filter functions on said signal to eliminate background noise, suppress artifacts and provide discrimination to said fault detection data contained therein.

11. The apparatus defined by claim 10, wherein said means for performing said filter function separates capacitive-discharge test signal information from background noise within the fault detection data.

12. The apparatus defined by claim 11, wherein said means for performing said FIR filter function comb filters said signal at multiples of 60 Hz and notch filters said comb-filtered data at low frequency multiples of 25 Hz.

13. The apparatus defined by claim 10, wherein said means for performing a filter function performs an integration function on said signal to derive current-based information.

14. The apparatus defined by claim 13, wherein said means for performing enable discrimination between faulted and unfaulted legs at a T junction.

15. The apparatus defined by claim 12, wherein:
   a) said comb filter function generates a response to an input signal $U_n$ substantially equivalent to:

$$-\tfrac{1}{8}(U_{n-8p}+U_{n-7p}+U_{n-6p}+U_{n-5p}+U_{n-3p}+U_{n-2p}+U_{n-p}+U_n)+U_{n-4p},$$

where $F_s$ is the sampling frequency and p equals the number of samples in a 60 Hz period; and
   b) said IIR filter function may be described by a digital transfer function:

$$(1+z^{-1})/[1-((1-\delta)z^{-1}/(1+\delta)],$$

where $\delta=\tfrac{1}{2}\tau F_S$ and $\tau$ is an integrator time constant.

16. The apparatus defined by claim 15, wherein said means for performing said IIR filter function may be described by a digital transfer function substantially equivalent to:

$$(1+2z^{-1}+z^{-2})/[1-(2z^{-1}(1-\delta))/(1+\delta)+((1-\delta)/(1+\delta))^2 z^{-2}].$$

17. The apparatus defined by claim 1, wherein said processing means includes means to perform an FIR comb filter function on said test signal which removes odd-order 60 Hz noise harmonics from said fault detection data.

18. The apparatus defined by claim 17, wherein said processing means includes means for providing a narrowband line detector function to detect test signal energy within said test signal at one of 120 and 240 Hz, said detector function in series with said means for performing said FIR comb filter function.

19. The apparatus defined by claim 17, wherein said FIR filter function generates a response to an input signal $U_n$ substantially equivalent to:

$$\tfrac{1}{4}[U_{n-p}+(2)U_{n-(p/2)}+U_n],$$

where $F_s$ is the sampling frequency and p is the number of samples in a 60 Hz period.

20. The apparatus defined by claim 17, wherein said processing means further includes means for implementing an IIR filter function.

21. The apparatus defined by claim 20, wherein said IIR filter-function means includes means for distributing the data along first and second channels connected which each direct data processed by each function to an adder function where said data processing is added and provided to a function for generating a signal representative of a square root of a value output by said adder, and wherein said first channel performs a Co filter function and a signal data value squaring function and said second channel performs a Quad filter function and a signal data value squaring function.

22. The apparatus defined by claim 21, wherein said Co filter function is described with a digital transfer function substantially equivalent to:

$$[2\alpha\beta/X+2\alpha\beta z^{-2}/X]/Y,$$

where

Y equals $[1+(2z^{-1}(\omega_o^2-\beta^2)/X)+(z^{-2}\beta^2-2\alpha\beta+\omega_o^2))]/X$, X equals $B^2+2\alpha\beta+\omega_o^2$, $\omega_o$ equals the peak frequency in radians/sec, $\alpha$ equals two pi ($\pi$) times the half-power line width and $\beta$ equals $\omega_o \cot(\omega_o/F_S)$.

23. The apparatus defined by claim 22, wherein said Quad filter function is described with a digital transfer function substantially equivalent to:

$$2\alpha\omega_o(1+2z^{-1}+z^{-2})/XY.$$

24. The apparatus defined by claim 19, further including in series with said FIR filter function:
   a) means for performing an IIR filter function upon said response;
   b) means for generating an absolute value of said filtered response; and
   c) means for low-pass filtering said filtered response.

25. The apparatus defined by claim 24, wherein said IIR filter function displays a transfer function substantially equivalent to:

$$[2\alpha\beta/X - 2\alpha\beta z^{-2}/X]/Y,$$

where Y equals: $1+(2z^{-1}(\omega_o^2\beta^2)/X)+(z^{-2}(\beta^2-2\alpha\beta+\omega_o^2)/X)$,
$X = \beta^2 + 2\alpha\beta + \omega_o^2$,
$\omega_o$ equals the peak frequency, $\alpha$ equals two pi ($\pi$) times the half-power line width and $\beta$ equals $\omega_o \cot(\omega_o/F_S)$.

26. The apparatus defined by claim 22, wherein said peak frequency is one of: (a) $240\pi$ radians per second, and (b) $480\pi$ radians per second.

27. The apparatus defined by claim 3, wherein said display is manufactured according to one of the following technologies: electroluminescent, plasma vacuum fluorescent and liquid crystal.

28. The apparatus defined by claim 3, wherein said display is a liquid crystal display manufactured using super twisted nematic technology.

29. The apparatus defined by claim 1, wherein said apparatus is hand-held.

30. The apparatus defined by claim 1, wherein said apparatus is vehicle-mounted.

31. The apparatus defined by claim 17, wherein said processing means includes means for performing a matched filtering function to provide enhanced processing ability and enable identification of current flow direction within said cable under test.

32. The apparatus defined by claim 31, wherein said sensor interface and said processing means include cooperating means for identifying and compensating for variances in a distance from said apparatus to said cable under test.

33. The apparatus as defined by claim 10, wherein said sensor interface and said processing means include cooperating means for identifying and compensating for variances in a distance from said apparatus to a cable under test.

34. The apparatus defined by claim 1, further including an electromagnetic sensor connected to said interface.

35. A method for localizing a fault within an electrical power cable, comprising the steps of:

a) detecting a test signal propagating along said electrical power cable;
   b) conditioning said detected test signal within signal conditioning means to generate a data signal;
   c) processing said data signal within signal processing means using predetermined test signal signatures to generate user display data; and
   d) communicating said user display data to a user.

36. The method defined by claim 35, wherein said conditioning includes anti-alias filtering and providing a gain to said detected test signal.

37. The method defined by claim 36, further including a step of converting said test signal to a digital data signal within an analog to digital converter.

38. The method defined by claim 37, wherein said step of processing includes processing said digital signal data within a digital signal processor.

39. The step of claim 37, wherein said step of processing includes generating digital user display data and said step of communicating includes converting said digital data to an analog signal within a digital to analog converter.

40. The method defined by claim 35, wherein said step of processing includes performing a comb filtering function on said data signal to eliminate periodic noise from said data signal.

41. The method defined by claim 40, wherein said performing includes eliminating noise at multiples of 60 Hz from said data signal.

42. The method defined by claim 41, wherein said performing includes performing a second filtering function upon said comb-filtered data signal to allow discrimination between faulted and unfaulted legs of said cable at a T-junction.

43. The method defined by claim 42, wherein said performing said second filtering function includes integrating said comb-filtered data.

44. The method defined by claim 42, wherein said performing further includes performing a notch filtering function on said data signal to remove period noise at several low frequencies.

45. The method defined by claim 44, wherein said frequencies are at multiples of 25 Hz.

46. The method defined by claim 40, wherein said performing includes removing noise at odd multiples of 60 Hz from said data signal.

47. The method defined by claim 46, wherein said performing includes performing a second filtering function upon said data signal whereby the effective signal energy at one of 120 Hz and 240 Hz is substantially extracted.

48. The method defined by claim 46, wherein said performing includes performing a matched filtering function on said data signal to identify replicas of a known test set signal in a background of essentially periodic noise.

\* \* \* \* \*

UNITED STATES PATENT AND TRADEMARK OFFICE
CERTIFICATE OF CORRECTION

PATENT NO. : 5,570,028

DATED : October 29, 1996

INVENTOR(S) : T. M. Sperlazzo et al.

It is certified that error appears in the above-identified patent and that said Letters Patent is hereby corrected as shown below:

```
Title page:
```
Assignee (section [73]) is changed from "Lucent Technologies Inc., Murray Hill, N.J." to --Consolidated Edison Company of New York, Inc., New York, N.Y.--

Signed and Sealed this

Twentieth Day of January, 1998

Attest:

BRUCE LEHMAN

Attesting Officer

Commissioner of Patents and Trademarks